(12) United States Patent
Adan et al.

(10) Patent No.: US 8,299,525 B2
(45) Date of Patent: Oct. 30, 2012

(54) POWER IC DEVICE AND METHOD FOR MANUFACTURING SAME

(75) Inventors: Alberto O. Adan, Ikoma (JP); Mitsuhiro Kikuta, Kyotanabe (JP)

(73) Assignee: Sharp Kabushiki Kaisha, Osaka (JP)

( * ) Notice: Subject to any disclaimer, the term of this patent is extended or adjusted under 35 U.S.C. 154(b) by 321 days.

(21) Appl. No.: 12/086,257

(22) PCT Filed: Mar. 20, 2007

(86) PCT No.: PCT/JP2007/055622
§ 371 (c)(1),
(2), (4) Date: Jun. 9, 2008

(87) PCT Pub. No.: WO2007/119441
PCT Pub. Date: Oct. 25, 2007

(65) Prior Publication Data
US 2009/0273027 A1    Nov. 5, 2009

(30) Foreign Application Priority Data
Apr. 6, 2006    (JP) .................... 2006-105700

(51) Int. Cl.
*H01L 21/8238* (2006.01)
*H01L 29/78* (2006.01)

(52) U.S. Cl. ............. 257/334; 257/341; 257/E29.262; 257/E27.009; 257/E21.643; 438/585; 438/209

(58) Field of Classification Search ................ 257/334, 257/341, E29.262, E27.009, E21.643; 438/209, 438/585
See application file for complete search history.

(56) References Cited

U.S. PATENT DOCUMENTS

| | | | |
|---|---|---|---|
| 4,764,480 A * | 8/1988 | Vora ........................... | 438/203 |
| 4,795,716 A | 1/1989 | Yilmaz et al. | |
| 5,306,940 A * | 4/1994 | Yamazaki ................... | 257/374 |
| 5,593,915 A | 1/1997 | Ohoka | |
| 6,025,233 A | 2/2000 | Terasawa | |
| 6,153,458 A * | 11/2000 | Zamanian et al. ............ | 438/238 |
| 6,724,043 B1 * | 4/2004 | Ekkanath Madathil ...... | 257/341 |
| 6,900,495 B2 * | 5/2005 | Hofmann et al. ............. | 257/302 |

(Continued)

FOREIGN PATENT DOCUMENTS
EP    1 617 476 A2    1/2006

(Continued)

OTHER PUBLICATIONS
International Search Report dated Jun. 26, 2007, for PCT/JP2007/055622.

*Primary Examiner* — Tom Thomas
*Assistant Examiner* — Benjamin Tzu-Hung Liu
(74) *Attorney, Agent, or Firm* — Harness, Dickey & Pierce, P.L.C.

(57) ABSTRACT

In a power IC device, a surface layer channel CMOS transistor and a trench power MOS transistor are formed on the same chip. In one embodiment, a source region of the trench power MOS transistor is arranged at the same level as a gate electrode of the surface layer channel CMOS transistor. Thus, the power IC device and a method for manufacturing the power IC device are provided for reducing manufacturing cost in the case of forming the trench power MOS transistor and the surface layer channel CMOS transistor on the same chip.

22 Claims, 6 Drawing Sheets

U.S. PATENT DOCUMENTS

| | | |
|---|---|---|
| 2003/0117865 A1 | 6/2003 | Hofmann et al. |
| 2005/0275025 A1* | 12/2005 | Lanzerstorfer ............... 257/350 |
| 2006/0124996 A1* | 6/2006 | Mizokuchi et al. ........... 257/330 |

FOREIGN PATENT DOCUMENTS

| | | | |
|---|---|---|---|
| JP | 49-73982 | | 7/1974 |
| JP | 07-078986 | | 3/1995 |
| JP | 09-129868 | | 5/1997 |
| JP | 10-093086 | | 4/1998 |
| WO | WO 2004/053993 | * | 6/2004 |
| WO | WO2004053993 | * | 6/2004 |
| WO | WO 2004053993 | * | 6/2004 |

* cited by examiner

POWER IC DEVICE AND METHOD FOR MANUFACTURING SAME

TECHNICAL FIELD

The present invention relates to a structure of a power IC device and a method for manufacturing the power IC device, which includes (i) a trench power MOS (Metal Oxide Semiconductor) mainly used for switching such as (a) a high-current switching or high-voltage switching for an electric power supply and/or an electric power conversion or (b) a load switching serving as a relay, and (ii) a CMOS (Complementary Metal Oxide Semiconductor) which is used, for example, for controlling the trench power MOS transistor, both (i) and (ii) being formed on the same chip.

In this description, the trench power MOS transistor means a power MOS transistor, which is formed by using a trench on the surface of a chip. In other words, the power MOS transistor is formed by using a trench dug with respect to the surface of the tip.

In this description, the power IC device means a device in which both a power MOS transistor and a CMOS transistor are integrated.

BACKGROUND ART

A power IC (Integrated Circuit) device has been developed by integration of (i) a power MOS (Metal Oxide Semiconductor) transistor, which can deal with high voltage and/or high current and (ii) a control circuit for controlling the power MOS transistor. This is because the power IC device is used for an electric power management and an electric power controlling.

In particular, a DMOS (Double Diffused Metal Oxide Semiconductor) transistor has been attracting attentions as an efficient power MOS transistor. This is because the DMOS transistor can deal with high electric power required for an electric power supply and a motor control.

Regarding this power IC device, for example, patent document 1 discloses a power IC device in which a DMOS transistor and a CMOS transistor for controlling the DMOS transistor are integrated, as illustrated in FIG. 7.

As to the power IC device, it is efficient to use a trench power MOS transistor as a power MOS transistor such as a DMOS transistor. This allows an improvement in integration rate, i.e., this allows the surface of the silicon wafer to be further effectively utilized.

Note that the trench power MOS transistor means a power MOS transistor, which is formed by using a trench on the surface of a chip. In other words, a power MOS transistor, which is formed by using a trench dug on the surface of the tip.

This trench power MOS transistor can be applied to such a device structure disclosed in the patent document 1. Namely, a trench power MOS transistor and a control COMS transistor for controlling the trench power MOS transistor can be arranged so as to be integrated on the same chip.

Also, it is possible to improve the integration rate of the power IC device by using a trench power MOS transistor as a power MOS transistor. The reason is that a trench power MOS transistor requires smaller area on the surface of a silicon wafer than a DMOS transistor.

As another power IC device structure, unlike the structure that a power MOS transistor and a control CMOS transistor are integrated on the same chip, there is, for example, a structure that each transistor is formed on a separate chip, and is then built in the same package. This is for the purpose of reducing the manufacturing cost.

[Patent Document 1] Specification of U.S. Pat. No. 4,795,716 (issued on Jan. 3, 1989)

DISCLOSURE OF INVENTION

However, the conventional power IC devices in any structure and methods for manufacturing same have a problem of increase in the manufacturing cost of the power IC device.

Practically, the problem lies in the fact that a control CMOS transistor and a trench power MOS transistor are manufactured separately in each different manufacturing process. This arises the problem of increase in the manufacturing cost of the power IC device.

This problem inevitably arises when each transistor is formed on a separate chip. Similarly, this kind of problem arises when both transistors are formed on the same chip.

Namely, there was no commonly involved step (common step) in the conventional manufacturing processes of both transistors, even though both transistors are formed on the same chip. This was because the formation method of a trench power MOS transistor is different from that of a surface layer channel CMOS transistor, which is commonly used as the control CMOS transistor. Note that the surface layer channel CMOS transistor means a CMOS transistor whose channel current flows in a direction which is in parallel with the surface of a chip.

The present invention is made in view of the forgoing problem. The objective of the present invention is to provide a power IC device and a method for manufacturing same, which can reduce the manufacturing cost, in cases where a trench power MOS transistor and a surface layer channel CMOS transistor are formed on the same chip.

In order to solve the problem, a power IC device in the present invention is a power IC device including a surface layer channel CMOS transistor and a trench power MOS transistor which are formed on the same chip. The trench power MOS transistor includes a source region provided at the same level as a gate electrode of the surface layer channel CMOS transistor.

Also, to solve the problem, a method for manufacturing the power IC device in the present invention is a method for manufacturing the power IC device including the surface layer channel CMOS transistor and the trench power MOS transistor which are formed in the same wafer. The gate electrode of the surface layer channel CMOS transistor and the source region of the trench power MOS transistor are formed in the same step.

Further, to solve the problem, a method for manufacturing the power IC device in the present invention is a method for manufacturing the power IC device including the surface layer channel CMOS transistor and the trench power MOS transistor which are formed in the same wafer. In fabricating the surface layer channel CMOS transistor, an inversion channel region is formed in a part of a surface layer of the wafer, in which part no trench is formed, so as to be in parallel with the surface layer. In fabricating the trench power MOS transistor, a trench is formed in a part of the surface layer of the wafer; a gate region is embedded in the trench; and an inversion channel region is formed on the sidewall of the trench. Further, (i) forming of a gate electrode on the inversion channel region in the fabricating of the surface layer channel CMOS transistor, and (ii) forming of a source region in the surface layer of the wafer, which is located above the gate region and the inversion channel region in the fabricating of the trench power MOS transistor, are carried out in the same step.

Further, to solve the problem, the power IC device in the present invention is a power IC device including the surface layer channel CMOS transistor and the trench power MOS transistor which are formed on the same chip. The source region of the trench power MOS transistor and the gate electrode of the surface layer channel CMOS transistor are formed in the same layer.

Further, to solve the problem, the power IC device in the present invention is a power IC device including the surface layer channel CMOS transistor and the trench power MOS transistor which are formed on the same chip. The surface layer channel CMOS transistor includes the inversion channel region formed in a part of the surface layer of the chip, in which part no trench is formed, so as to be in parallel with the surface layer, and the gate electrode formed on the inversion channel region. The trench power MOS transistor includes the gate region embedded in the trench, which is formed in a part of the surface layer of the chip, the inversion channel region formed on a sidewall of the trench, the source region formed on the surface layer of the chip, which surface layer is above the gate region and the inversion channel region, and a drain electrode formed in a back surface layer of the chip. The source region of the trench power MOS transistor and the gate electrode of the surface layer channel CMOS transistor are formed in the same layer.

According to the invention, the gate electrode of the surface layer channel CMOS transistor and the source region of the trench power MOS transistor are formed at the same level, in the same layer, and in the same step. This allows a reduction in the number of manufacturing processes and the cost for manufacturing a power IC device.

Therefore, it is possible to provide a power IC device and a method for manufacturing same at a low cost, in cases where the trench power MOS transistor and the surface layer channel CMOS transistor are formed on the same chip.

Other objectives, characteristics, and advantages of the present invention shall become clear according to the following description. Also, benefits of the present invention shall become clear according to the following description with reference to the accompanying drawings.

BRIEF DESCRIPTION OF DRAWINGS

FIG. 1 (b) is a cross-section view of a main part of the power IC device illustrating its manufacturing process following after FIG. 1 (a).

FIG. 1 (c) is a cross-section view of a main part of the power IC device illustrating its manufacturing process following after FIG. 1 (b).

FIG. 1 (d) is a cross-section view of a main part of the power IC device illustrating its manufacturing process following after FIG. 1 (c).

FIG. 3 (b) is a cross-section view of a main part of the power IC device illustrating its manufacturing process following after FIG. 3 (a).

FIG. 3 (c) is a cross-section view of a main part of the power IC device illustrating its manufacturing process following after FIG. 3 (b).

FIG. 3 (d) is a cross-section view of a main part of the power IC device illustrating its manufacturing process following after FIG. 3 (c).

FIG. 4 (b) is a cross-section view of a main part of the power IC device illustrating its manufacturing process following after FIG. 4 (a).

FIG. 4 (c) is a cross-section view of a main part of the power IC device illustrating its manufacturing process following after FIG. 4 (b).

FIG. 4 (d) is a cross-section view of a main part of the power IC device illustrating its manufacturing process following after FIG. 4 (c).

FIG. 5 (b) is a cross-section view of a main part of the power IC device illustrating its manufacturing process following after FIG. 5 (a).

FIG. 5 (c) is a cross-section view of a main part of the power IC device illustrating its manufacturing process following after FIG. 5 (b).

FIG. 5 (d) is a cross-section view of a main part of the power IC device illustrating its manufacturing process following after FIG. 5 (c).

Figure 1A:
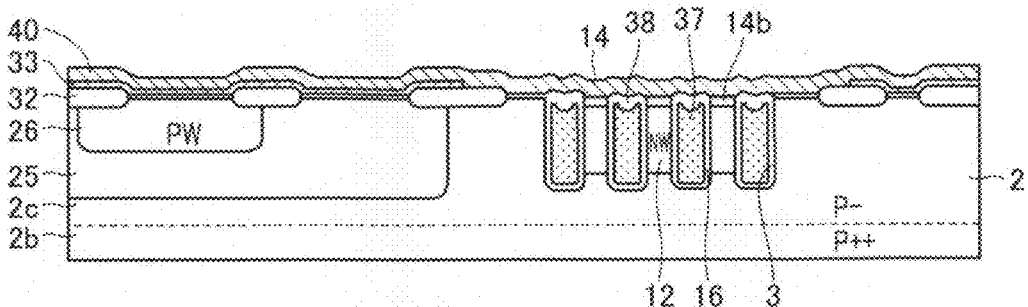
FIG. 1 (a) illustrates an embodiment of a power IC device in accordance with the present invention, and is a cross-section view of a main part of the power IC device illustrating its manufacturing process following after FIG. 4 (d).
Figure 1B:
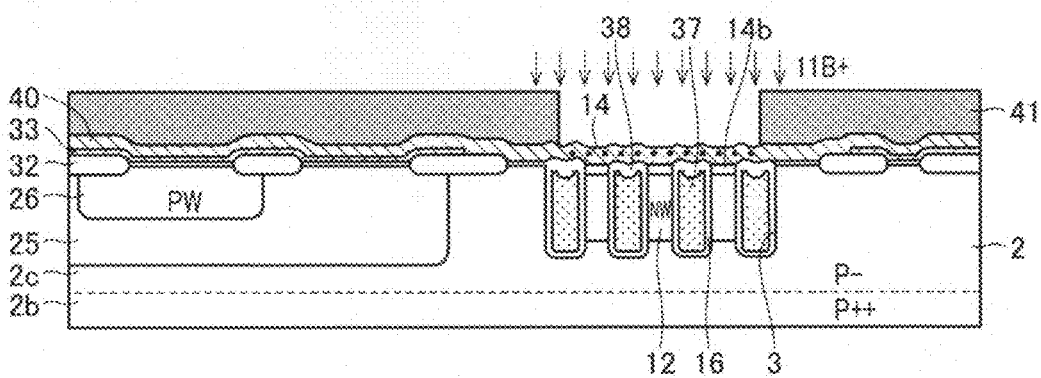
Figure 1C:
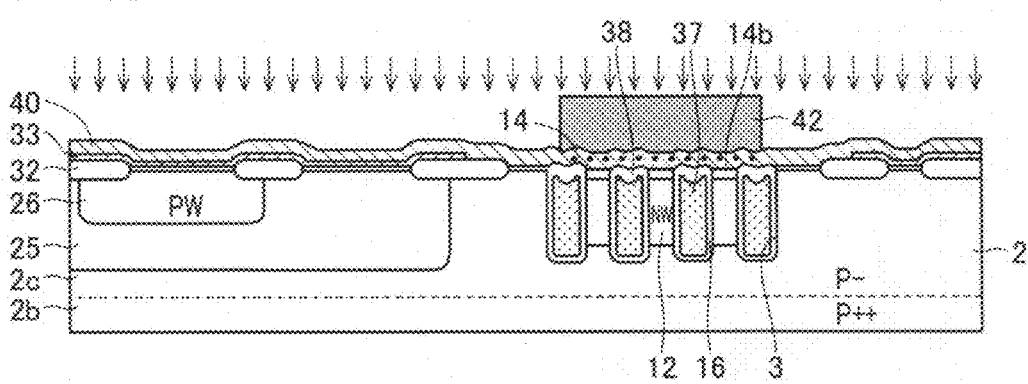
Figure 1D:
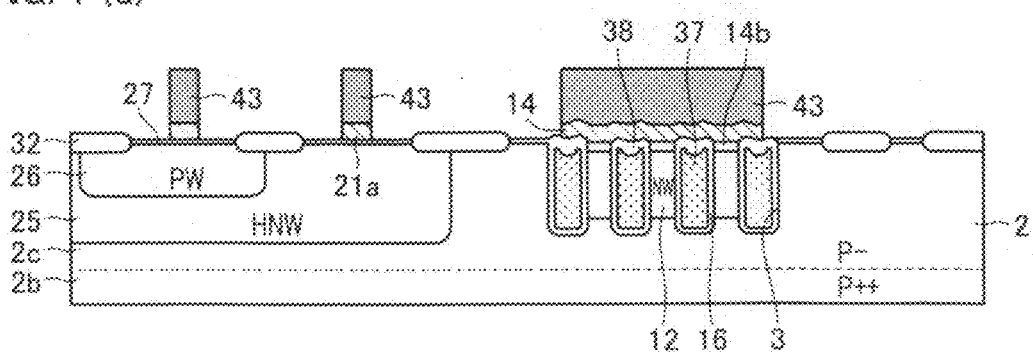

EXPLANATION OF REFERENCE NUMERALS 1 power IC device
2 silicon wafer (wafer)
2a chip
2b base layer
2c top layer
3 trench
10 trench power MOS transistor
11 gate region
11a gate electrode
12 inversion channel region
13 drain region
13a drain electrode
14 source region
14a source electrode
14b source region in N-well (NW)
15 N-well (NW) internal source region
16 gate insulating film
17 pad oxide film
20 surface layer channel CMOS transistor
21a gate electrode
22 inversion channel region
23 drain region
23a drain electrode
24 source region
24a source electrode
25 High Voltage N-well (NW)
26 P-Well (PW)
27 gate insulating film
30 Trench Power MOS Transistor Area (TA)
31 masking 32 Local Oxidation of Silicon
33 polysilicon layer (protective layer)
34 CVD oxide layer
35 SiN layer (masking layer)
36 CVD oxide layer
37 polysilicon
38 local oxidation of polysilicon
39 masking
40 polysilicon layer (a layer made by the same manufacturing step)
41 masking
42 masking
43 masking
44 masking
46 metal electrode
50 controlling circuit
51 temperature sensor circuit
52 current limit circuit
53 transistor
54 transistor

BEST MODE FOR CARRYING OUT THE INVENTION

The following description deals with an embodiment of the present invention with reference to FIG. 1 through FIG. 6.

A power IC (Integrated Circuit) device 1 of an embodiment in accordance with the present invention includes (i) a trench power MOS (Metal Oxide Semiconductor) transistor 10 and (ii) a surface layer channel CMOS (Complementary Metal Oxide Semiconductor) transistor 20, both of which are formed on a same chip 2a.

The trench power MOS transistor 10 includes a trench 3, having for example a rectangular parallelepiped shape, which is formed in a part of the surface layer of the chip 2a. A gate region 11 is embedded in the trench 3, and an inversion channel region 12 is formed on the sidewall of the trench 3.

Further, a drain electrode 13a is formed in the back surface layer of the chip 2a, while a source region 14 is formed in the front surface layer of the chip 2a, which front surface layer is located above the gate region 11 and the inversion channel region 12. For details, the source region 14 works, together with a source region in N-well (NW) 14b, as a source of the trench power MOS transistor 10, which N-well is located on the inversion channel region 12.

Further, a drain region 13 is formed between (i) a lower layer area of an N-well (NW) 15 which lower layer area is to be an inversion channel region 12 and (ii) the drain electrode 13a. This structure allows the channel current of the trench power MOS transistor 10 to flow the inversion channel region 12 in a thickness direction of the chip 2a.

On the other hand, the surface layer channel CMOS transistor 20 is formed in the surface layer of the chip 2a, in which the trench 3 is not formed.

Note that the surface layer channel CMOS transistor 20 has a conventional structure. Particularly, an inversion channel region 22 is formed in the surface layer of the chip 2a so as to be in parallel with the surface layer. In both sides of the inversion channel region 22, a drain region 23 and a source region 24 are formed respectively. Also, a gate electrode 21a is formed on the inversion channel region 22.

In the power IC device 1 of the present embodiment, the source region 14 of the trench power MOS transistor 10 and the gate electrode 21a of the surface layer channel CMOS transistor 20 are formed at the same level, in the same layer, and during the same manufacturing process.

Specifically, the source region 14 of the trench power MOS transistor 10 and the gate electrode 21a of the surface layer channel CMOS transistor 20 are formed in a polysilicon layer 40 (later described) which is a same polysilicon deposited layer.

Figure 3:
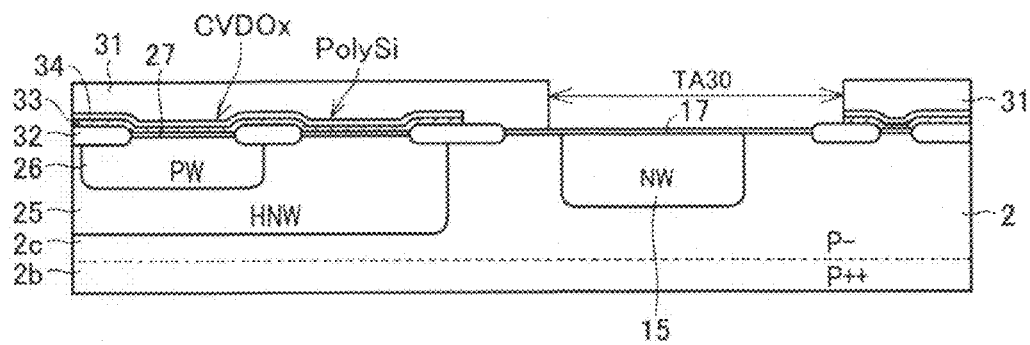
FIG. 3 (a) is a cross-section view of a main part of the power IC device illustrating the first step of its manufacturing process.
Figure 3:
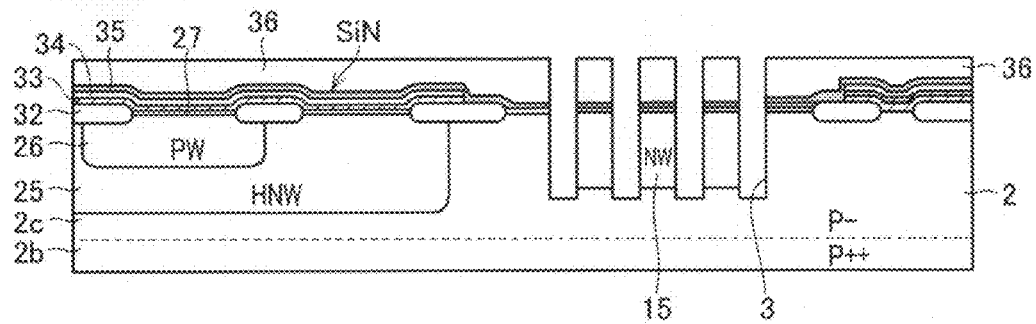
Figure 3:
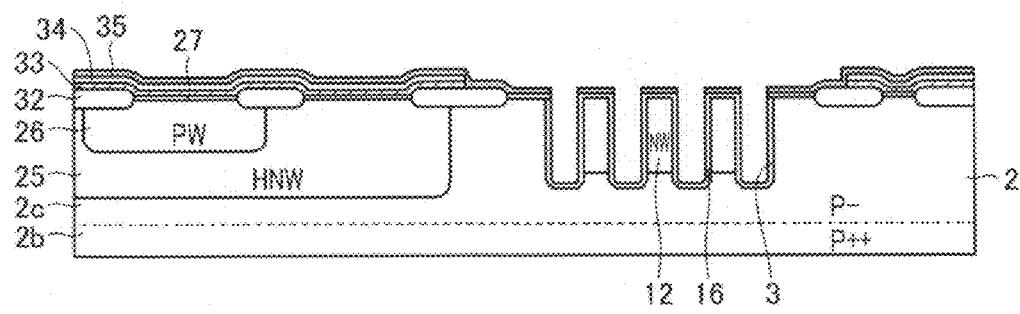
Figure 3:
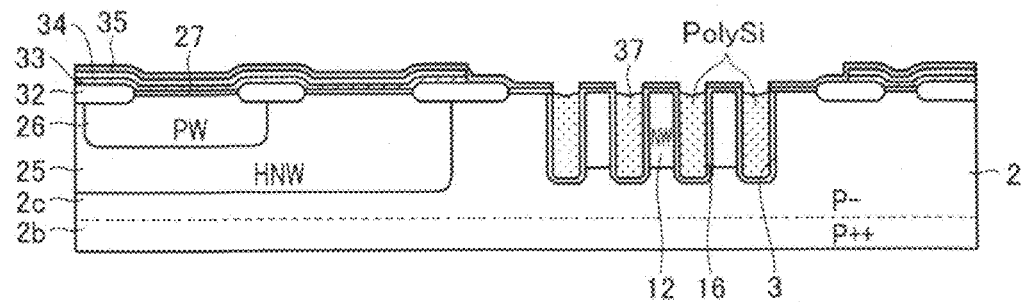
Figure 4:
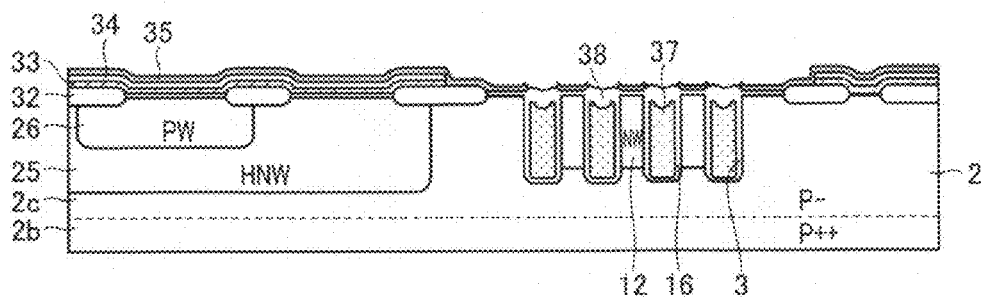
FIG. 4 (a) is a cross-section view of a main part of the power IC device illustrating its manufacturing process following after FIG. 3 (d).
Figure 4:
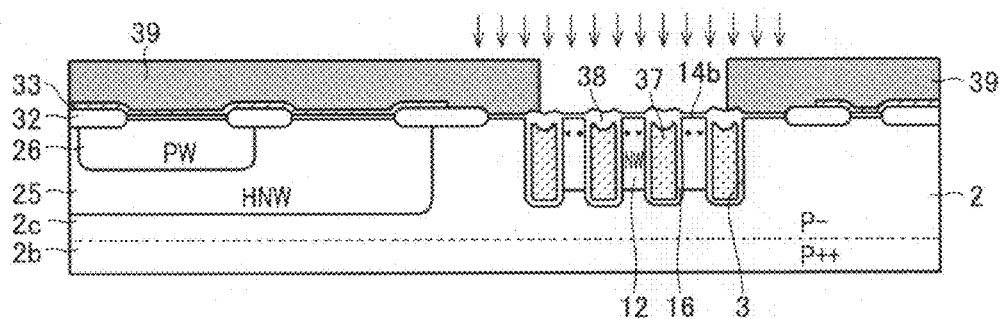
Figure 4:
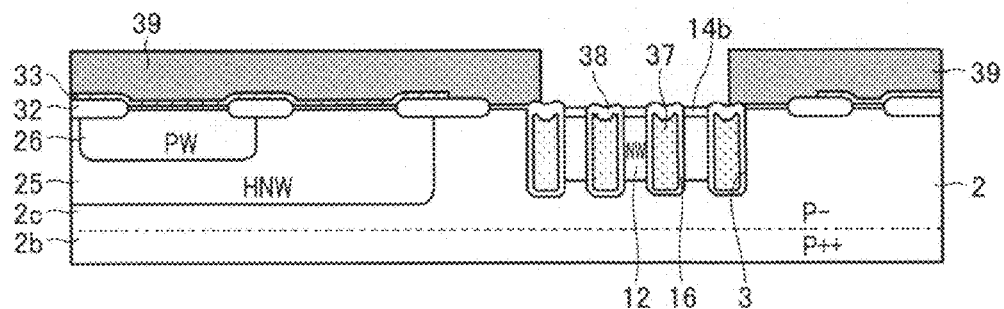
Figure 4:
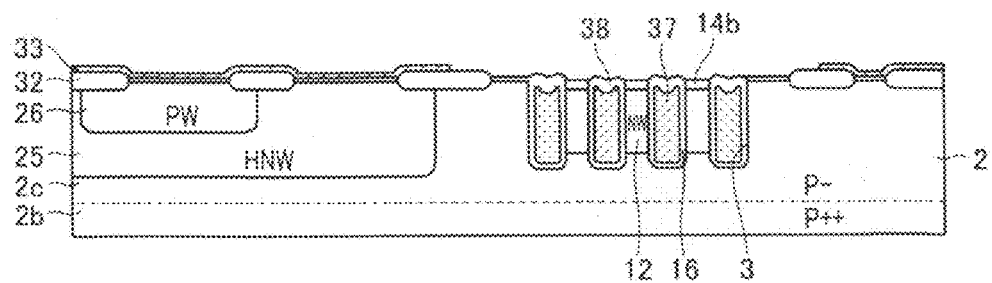
Figure 5:
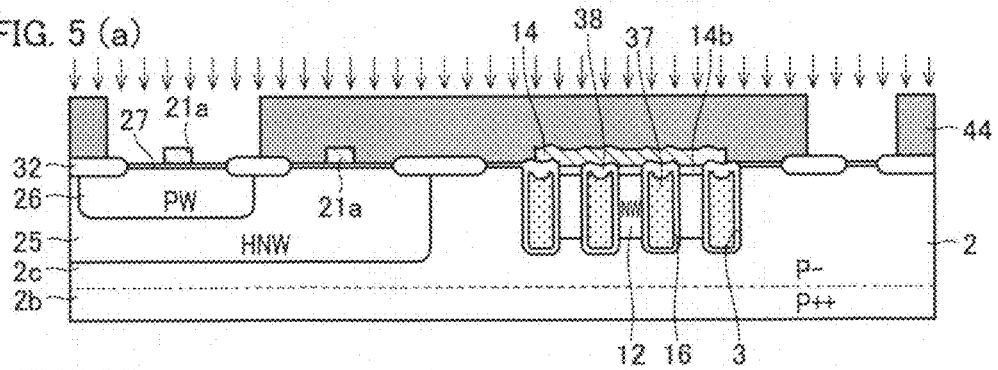
FIG. 5 (a) is a cross-section view of a main part of the power IC device illustrating its manufacturing process following after FIG. 4 (d).
Figure 5:
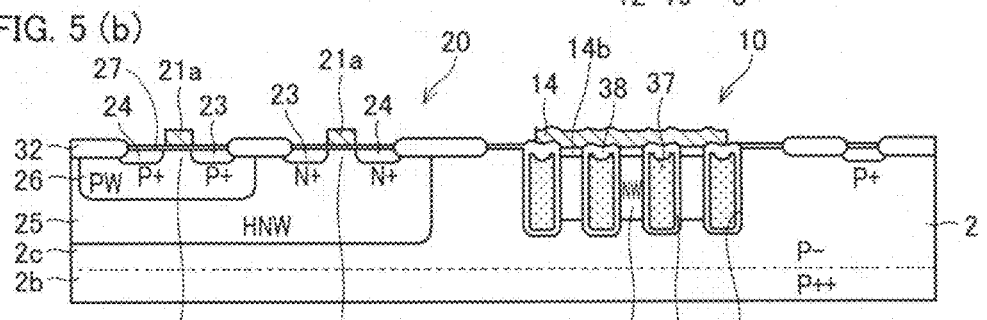
Figure 5:
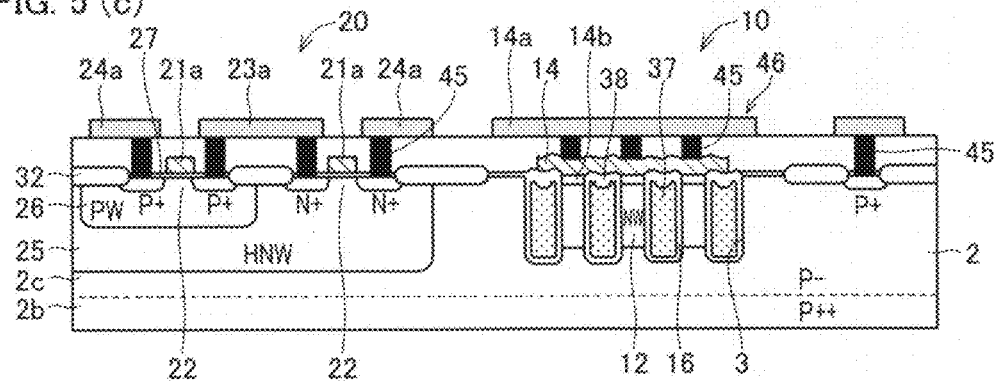
Figure 5:
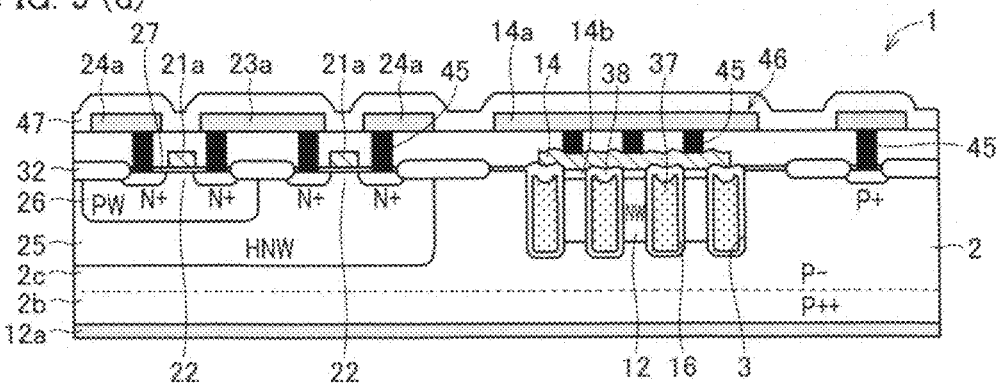

The following description deals with a method for manufacturing the power IC device having the above structure with reference to FIG. 3 (a) to FIG. 3 (d), FIG. 4 (a) to FIG. 4 (d), FIG. 1 (a) to FIG. 1 (d), and FIG. 5 (a) to FIG. 5 (d). Note that a method for manufacturing a P-channel type transistor is described, however, a method is not limited to this type. A similar method can be used in manufacturing an N-channel type transistor. A conventional IC manufacturing process can be applied in manufacturing a trench power MOS transistor 10 and a surface layer channel CMOS transistor 20 of the present embodiment, as needed.

First, as illustrated in FIG. 3 (a), a silicon wafer 2 is doped with boron so that P-type conductivity is given to the silicon wafer 2. At this time, the doping is carried out so that two layers, each having different carrier density, are formed in a thickness direction of the silicon wafer 2. This doping creates a base layer 2b and a top layer 2c located on the base layer 2b.

Specifically, the base layer 2b is doped so as to have an electric resistivity is, for example, from 0.001 to 0.005 Ω·cm.

On the other hand, the top layer 2c is doped so as to have a certain electric resistivity (Pepi) and a thickness (Xepi) determined according with the electrical characteristics which the trench power MOS transistor 10 should have. Specifically, for example, when a breakdown voltage which the P-channel type trench power MOS transistor 10 should have is 80V, the top layer 2c is doped so as to have an electric resistivity of 5 Ω·cm and a junction depth of 10 μm to 15 μm. The top layer 2c in this structure is formed as an epitaxial conductive layer.

Next, the surface of the epitaxial top layer 2c in the silicon wafer 2 is thermally oxidized, and then a High Voltage N-well (HNW) 25 for the surface layer channel CMOS transistor 20 is formed. Specifically, the High Voltage N-well (HNW) 25 is doped with phosphorus so as to be a junction depth of 5 μm to 8 μm.

Next, a P-Well (PW) 26 for the surface layer channel CMOS transistor 20 is formed. Specifically, this P-Well (PW) 26 is formed within an area of the High Voltage N-well (NW) 25 and is doped with boron so as to have a junction depth of 1.5 μm to 3 μm and a boron impurity density of about $1 \times 10^{17}$ at/cm$^3$ to $3 \times 10^{17}$ at/cm$^3$.

Next, an N-well (NW) 15 for the P-channel type trench power MOS transistor 10 is formed. Specifically, after providing a masking 31 to the surface layer of the silicon wafer 2 so that only a Trench Power MOS Transistor Area (TA) 30 is exposed, in which the trench power MOS transistor 10 is formed, the surface layer of the silicon wafer 2 is doped with phosphorus. For details, the surface layer of the silicon wafer 2 is doped with phosphorus so as to have a junction depth of 1.5 μm to 3.0 μm and has an impurity density of about $0.5 \times 10^{17}$ at/cm$^3$ to $2 \times 10^{17}$ at/cm$^3$.

After forming the High Voltage N-well (HNW) 25, the P-Well (PW) 26, and the N-well (NW) 15 by doping, a drive-in diffusion at 1050° C. is performed to get the final doping profile.

Next, a pad oxide film 17 is formed to be about 30 nm or less in thickness, and a nitride film (not illustrated in a figure) is formed to be about 120 nm or less in thickness.

Then, the entire surface of the silicon wafer 2 is exposed by removing the masking 31, which masking 31 causes only the Trench Power MOS Transistor Area (TA) 30 to be exposed. Namely, the entire surface of an active area, in which the trench power MOS transistor 10 and the surface layer channel CMOS transistor 20 are formed, is exposed in the surface of the silicon wafer 2.

After that, a Local Oxidation of Silicon (LOCOS) 32 is formed. Specifically, the Local Oxidation of Silicon 32 is formed to be 300 nm to 600 nm in thickness. This allows device isolation of the surface layer channel CMOS transistor 20. The Local Oxidation of Silicon 32 may be formed by a known method.

After the formation of the Local Oxidation of Silicon 32, a gate insulating film 27 of the surface layer channel CMOS transistor 20 is formed. Specifically, the gate insulating film 27 is formed by the thermal oxidation of the silicon wafer 2 so as to be, for example, 14 nm to 20 nm in thickness determined in accordance with a drive voltage.

In order to protect the gate insulating film 27, a polysilicon layer 33 and a CVD oxide layer 34 are formed above the gate insulating film 27 and on the entire surface of the silicon wafer 2. Specifically, the polysilicon layer 33 is formed so as to be 50 nm to 100 nm in thickness, and the Chemical Vapor Deposition (CVD) oxide layer 34 is further formed so as to be about 50 nm in thickness. After that, a part of the polysilicon layer 33 and the CVD oxide layer 34 formed on the entire surface of the silicon wafer 2, which part covers the TA 30 of the silicon wafer 2, is removed. This removal is carried out by a known method, i.e., is carried out based on patterning by photo-etching.

This patterning causes only the area where the surface layer channel CMOS transistor 20 is to be formed, to be covered with the polysilicon layer 33 serving as a protection layer. Therefore, this makes it possible to form the trench power MOS transistor 10 while the surface layer channel CMOS transistor 20 is protected.

Next, as illustrated in FIG. 3 (b), a SiN layer 35, serving as a masking layer, is formed so as to be about 120 nm in thickness, (i) on the CVD oxide layer 34 that has been subjected to the patterning and (ii) on the entire surface of the silicon wafer 2. Then, the CVD oxide layer 36 is further formed so as to be about 300 nm in thickness.

Note that, when the trench 3 (later described) is formed, the trench 3 and the SiN layer 35 are patterned at the same time. When a local oxidation of polysilicon 38 is formed as an insulating film of the gate region 11 in the trench power MOS transistor 10, the SiN layer 35 works as a self-aligning mask. This will be later described in detail.

Next, the trench 3 in rectangular parallelepiped shape is formed in TA 30 in the surface layer of the silicon wafer 2 by a conventional photo-etching technique. Note that the trench 3 means a trench dug with respect to the surface of the silicon wafer 2 in a thickness direction of the silicon wafer 2.

The trench 3 is formed after the SiN layer 35 and the CVD oxide layer 36 are formed. Therefore, only a part of the SiN layer 35 and the CVD oxide layer 36, which part corresponds to an opening of the trench 3, is removed. As a result, (i) the opening of the trench 3 and (ii) the part thus removed in the SiN layer 35 and the CVD oxide layer 36 never has a displacement because of a self-aligning. Namely, the self-aligning means that the opening of the trench 3 and the opening of the SiN layer 35 become automatically identical based on the following fact. Namely, in the case of using the opening of the SiN layer 35 as a masking when the local oxidation of polysilicon 38 is formed on the gate region 11 in the trench power MOS transistor 10, the opening of the trench 3 and the opening of the SiN layer 35 are simultaneously formed in the previous step.

Next, as illustrated in FIG. 3 (c), after forming the trench 3, the CVD oxide layer 36 is removed. Then, the thermal oxidation is carried out at 1050° C. under wet ambient so as to be a thickness of 200 nm, and then the oxidized layer is removed. This allows a reduction in surface roughness of the sidewall of the trench 3. After that, the thermally oxidized layer is removed.

Next, the internal surface of the trench 3 is oxidized so that a gate insulating film 16 of the P-channel type trench power MOS transistor 10 is formed. Specifically, the oxidation is performed by a known method, i.e., by a silicon thermal oxidation, or by a combination of a silicon oxidation and a CVD oxidation.

The thickness of the gate insulating film 16 is determined by the voltage condition and the specification of the electric properties which the trench power MOS transistor 10 should have. For example, when a withstand voltage of 80V is required, it is designed that the gate insulating film has a thickness of 40 nm to 80 nm.

Figure 2:
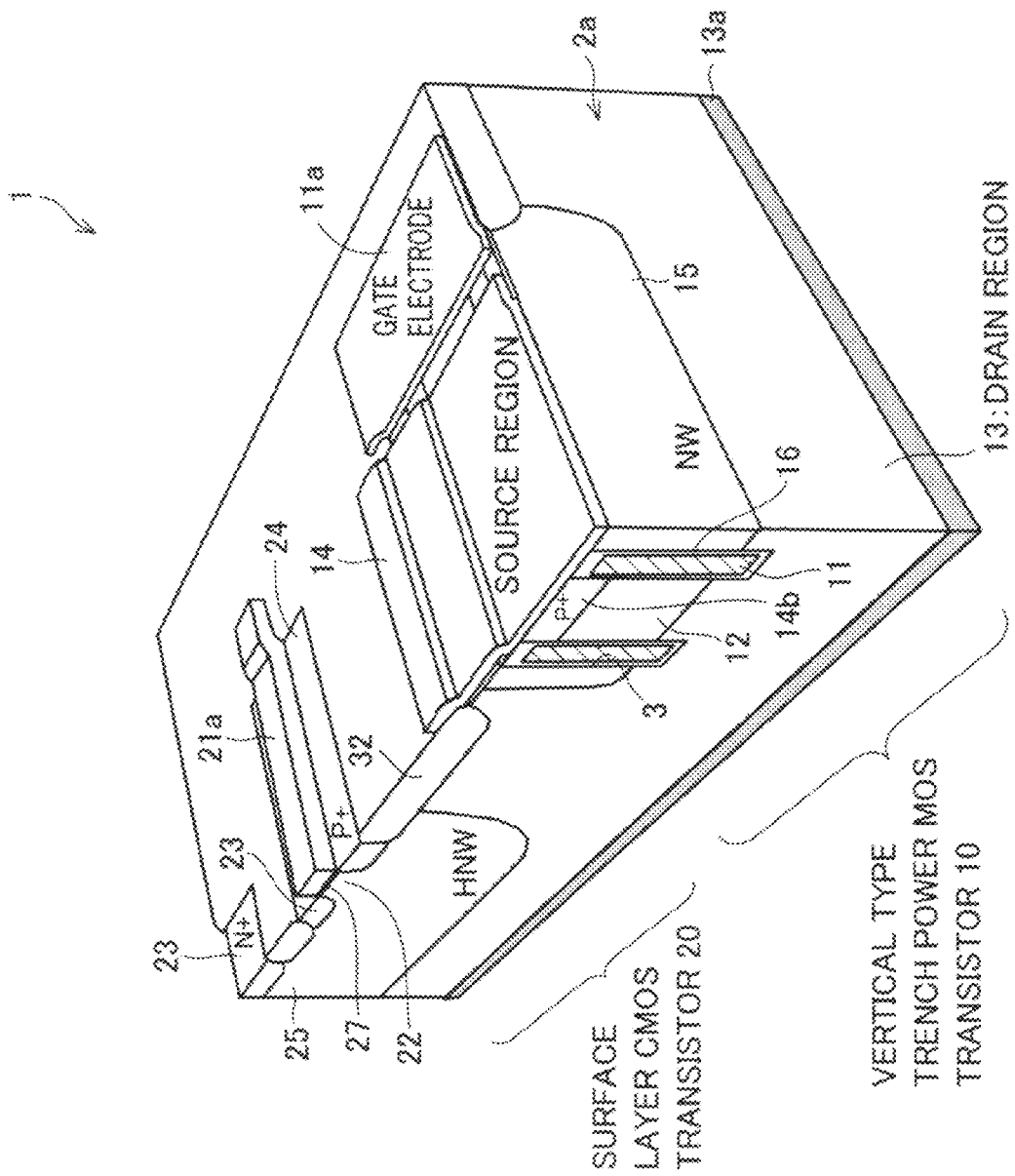
FIG. 2 is a perspective view of a main part of the power IC device.

Next, as illustrated in FIG. 3 (d), the gate region 11 is formed in the trench 3 (see FIG. 2). Specifically, a polysilicon 37 is fill up in the trench 3 in which the gate insulating film 16 has been formed. Then, the gate region 11 is formed by being doped with $POCl_3$ so that the gate region 11 obtains N-type conductivity.

Next, the polysilicon 37 overflowed from the trench 3 is removed so that the upper edge of the trench 3 is planarized. This planarization can be made by a known method, for example, etch-back and Chemical Mechanical Polishing (CMP) technique.

Next, as illustrated in FIG. 4 (a), the planarized upper layer part of the gate region 11 is insulated. Specifically, the gate region 11 is insulated by creating the local oxidation of polysilicon 38, which is made by oxidizing the upper layer part of the polysilicon 37 filled in the gate region 11.

At this point, this oxidation is done by using the SiN layer 35 as a mask. Because of the self-alignment of the trench 3 and the SiN layer 35, the upper layer part of the gate region 11 can be selectively oxidized.

Next, as illustrated in FIG. 4 (b), a source region in N-well (NW) 14b is formed in the N-well (NW) 15 (see FIG. 3 (a)), which is in the vicinity of the local oxidation of polysilicon 38. Specifically, after forming a masking 39 having an opening, corresponding to the upper layer parts of the gate region 11 and the N-well 15, the N-well (NW) 15 is selectively doped with boron. This allows the source region in N-well 14b to be formed.

This source region in N-well (NW) 14b is for securing a substantial thickness of the source region 14. Namely, there is a possibility that the TA 30 in the surface of the silicon wafer 2 may be eroded when the local oxidation of polysilicon 38 is formed. This may cause the substantial thickness of the source region 14 located on the local oxidation of polysilicon 38 and the N-well (NW) 15 to become thinner because of this erosion. Therefore, an upper layer part of the N-well (NW) 15 is functioned as the source region 14 so that source region 14 is secured to have a substantial thickness.

Thus, the source region in N-well (NW) 14b works together with the source region 14 (later described), which is located on the source region in N-well (NW) 14b, i.e., which is formed so as to be upheaved from the upper layer of the source region in N-well (NW) 14b.

Next, as illustrated in FIG. 4 (c), after being doped with boron, the oxidized surface layer, which is located on the source region in N-well (NW) 14b, is removed.

Then, as illustrated in FIG. 4 (d), the masking 39, which covers the surface of silicon wafer 2 except the area of TA 30 (see FIG. 3 (a)), is removed.

Next, as illustrated in FIG. 1 (a), a polysilicon layer 40 is formed over the entire surface of the silicon wafer 2.

The polysilicon layer 40 works as the source region 14 of the trench power MOS transistor 10 and as the gate electrode 21a of the surface layer channel CMOS transistor 20, after going through the patterning (see FIG. 2). Namely, in the present embodiment, the source region 14 of the trench power MOS transistor 10 and the gate electrode 21a of the surface layer channel CMOS transistor 20 are formed by a single deposited layer on the entire surface layer of the silicon wafer 2.

Next, as illustrated in FIG. 1 (b), the source region 14 for the trench power MOS transistor 10 is formed by using the polysilicon layer 40. Specifically, the polysilicon layer 40 except the area of TA 30 is covered with a masking 41. Then the polysilicon layer 40 in the TA 30 is selectively doped with boron. At this time, the doping concentration is, for example, $2 \times 10^{15}/cm^2$.

Next, as illustrated in FIG. 1 (c), a doping is carried out as a preparation stage, before forming the gate electrode 21a for the surface layer channel CMOS transistor 20 by using the polysilicon layer 40. Specifically, a part of the polysilicon layer 40, which corresponds to the above TA 30, is covered with a masking 42, then the remaining part of the polysilicon layer 40 which is not covered with the masking 42 is doped with 31 $P^+$ ion (phosphorus ion having 31 atomic weight) selectively. The doping concentration is, for example, $2 \times 10^{15}$ ions/$cm^2$.

Next, as illustrated in FIG. 1 (d), the gate electrode 21a for the surface layer channel CMOS transistor 20 and the source region 14 for the trench power MOS transistor are formed by patterning the polysilicon layer 40 with the use of photo-etching while using a masking 43.

As described above, although the polysilicon layer 40 is a layer formed during a single process, it is arranged so as to have two different functions, depending on the part, as the source region 14 for the trench power MOS transistor 10, and as the gate electrode 21a for the surface layer channel CMOS transistor 20.

After the above process, any known methods can be used to complete the power IC device 1.

First, as illustrated in FIG. 5 (a), as a preparation stage of forming the source region 24 and the drain region 23 (see the FIG. 2) of the surface layer channel CMOS transistor 20, the polysilicon layer 40 (see FIG. 1 (a)) is doped selectively after forming a masking 44 as needed. As illustrated in FIG. 5 (b), this doping is carried out with respect to regions $N^+$ and $P^+$ so that the surface layer channel CMOS transistor 20 and the trench power MOS transistor 10 are formed.

Next, as illustrated in FIG. 5 (c), metal electrodes 46, such as (i) the gate electrode 11a (see FIG. 2) and the source electrode 14a of the trench power MOS transistor 10 and (ii) the drain electrode 23 and the source electrode 24a of the surface layer channel CMOS transistor 20, are formed by using a general technique, such as a metal interconnection 45.

Then, as illustrated in FIG. 5 (d), after forming a metal passivation layer 47 on the surface layer (surface passivated layer), the power IC device 1 is completed via processes such as surface polishing and back metalization.

The following description deals with the relation in the power IC device 1 between the surface layer channel CMOS transistor 20 and the trench power MOS transistor 10.

In the power IC device 1 of the present embodiment, as illustrated in FIG. 2, the surface layer channel CMOS transistor 20 and the trench power MOS transistor 10 are formed on the same chip 2a. The surface layer channel CMOS transistor 20 is formed for controlling the trench power MOS transistor 10.

The control carried out by the surface layer channel CMOS transistor 20 with respect to the trench power MOS transistor 10 includes, for example, current control, voltage control, and temperature control. The followings are the specific examples of current control and temperature control.

Figure 6:
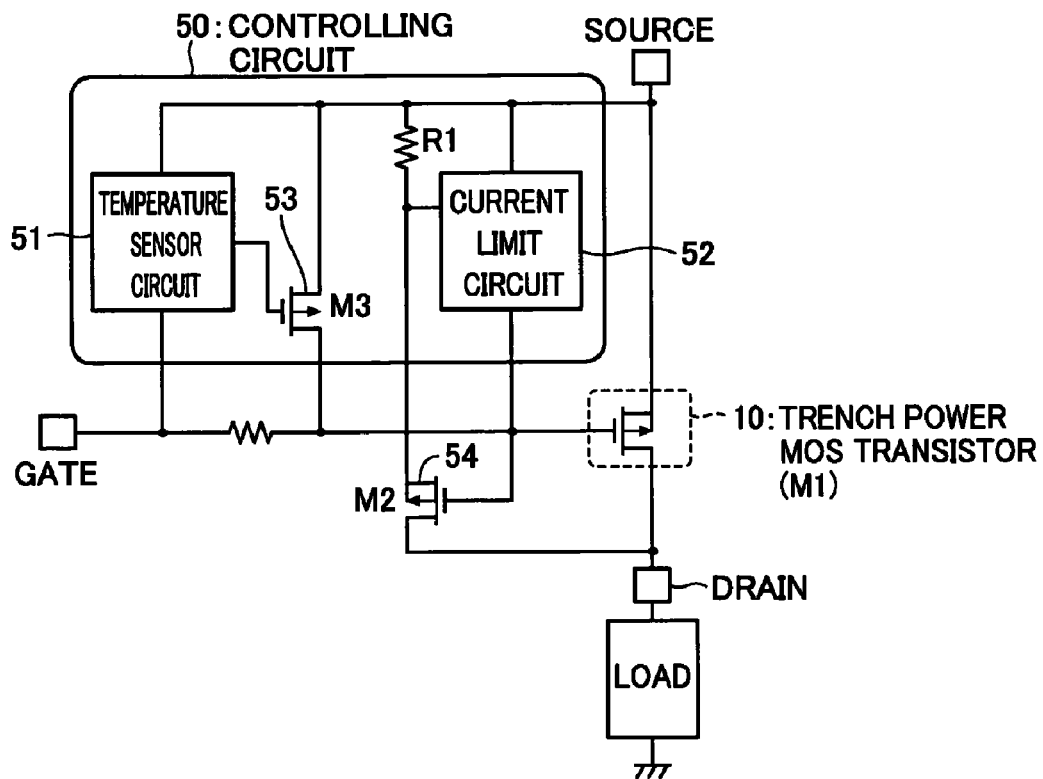
FIG. 6 is a block diagram of the control circuit of the power IC device.
Figure 7:
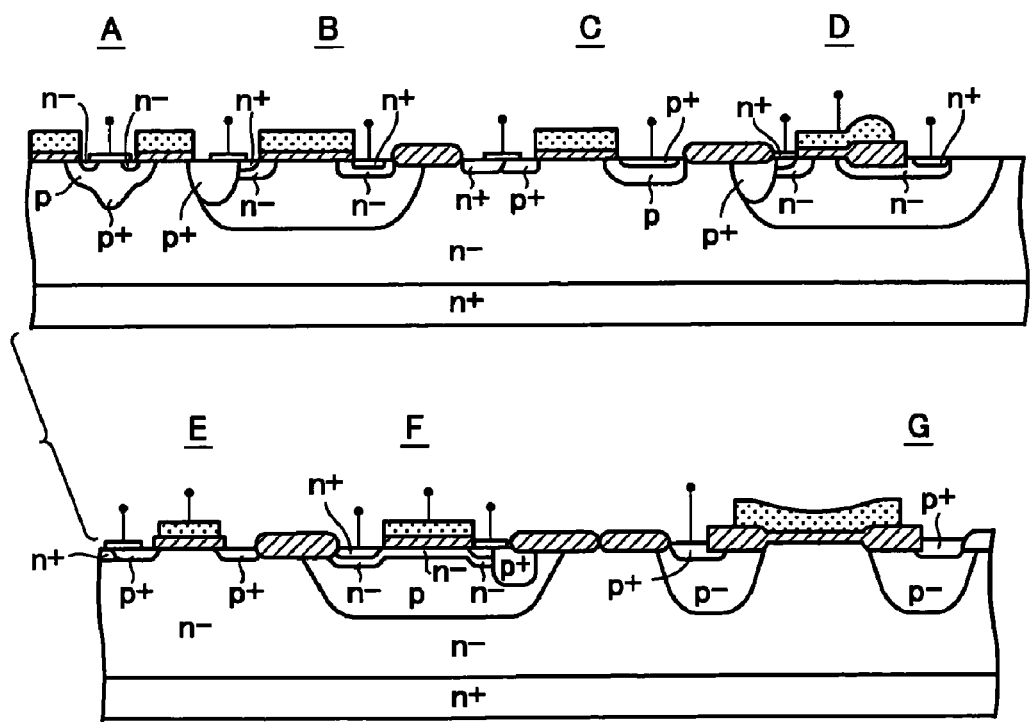
FIG. 7 is a cross-section view of a main part of a conventional IC device.

The current control and temperature control are carried out by a control circuit 50 including a temperature sensor circuit 51 and a current control circuit 52 as illustrated in FIG. 6. FIG. 6 is a circuit diagram illustrating the control circuit 50. The control circuit 50 is provided for controlling the trench power MOS transistor (M1) 10, which switches high current ranging from several amperes to tens of amperes. The control circuit 50 mainly includes a temperature sensor circuit 51, which detects overheat heat state, a current control circuit 52, and a transistor (M3) 53 for switching. A small transistor (M2) 54 is provided so as to be in parallel with the trench power MOS transistor (M1) 10 so as to supply control information to the control circuit 50.

Next, the following description deals with how the control circuit 50 operates. While the trench power MOS transistor (M1) 10 supplies electric power to a load, the transistor (M2) 54 monitors the current which flows the trench power MOS transistor (M1) 10, etc. When the transistor (M2) 54 detects the unusual current or unusual overheat state, their information is conveyed to the control circuit 50. Such information causes the control circuit 50 to activate the transistor (M3) 53, which is provided in the control circuit 50 for switching control.

Specifically, the transistor (M3) 53 causes the trench power MOS transistor (M1) 10 to be shut down. This assures safe operation of the trench power MOS transistor (M1) 10.

Thus, in a power IC device 1 of the present embodiment, a gate electrode 21a for a surface layer channel CMOS transistor 20 and a source region 14 for a trench power MOS transistor 10 are formed at the same level, in the same layer, and in the same process. This allows a reduction in the number of manufacturing processes and the cost for manufacturing a power IC device. In other words, the source region 14 of the trench power MOS transistor 10 and the gate electrode 21a of the surface layer channel CMOS transistor 20 are formed by the same evaporated layer. Therefore, both transistors can share a single silicon wafer 2, which is a common base material for both transistors, and a part of the manufacturing process of the silicon wafer 2. This allows both of the transistors to be streamlined in terms of the cost. As a result, it is possible to provide a power IC device 1 at a low cost, in cases where the trench power MOS transistor 10 and the surface layer channel CMOS transistor 20 are formed on the same chip 2a.

Therefore, it is possible to provide a power IC device 1 and a method for manufacturing same at a low cost, in cases where the trench power MOS transistor 10 and the surface layer channel CMOS transistor 20 are formed on the same chip.

Furthermore, in a power IC device 1 of the present embodiment, a layer, which is used for a source region 14 of a trench power MOS transistor 10 and a gate electrode 21a of a surface layer channel CMOS transistor, is made of amorphous silicon, polysilicon, or polycide. Therefore, a known IC manufacturing technique can be used for forming such a layer. This makes easier the formation of the layer, doping with respect to the layer, and pattern formation by etching. Furthermore, this layer allows a reduction in the limitation of the manufacturing conditions, because (i) this layer has high stability to heat and (ii) the control during forming of this layer is simple.

Further, in a power IC device 1 of the present embodiment, the trench power MOS transistor 10 is a P-channel type transistor. Preferably, the chip 2a includes a top layer 2c, a base layer 2b located under the top layer 2c, and the drain electrode 12a of the trench power MOS transistor 10 located under the base layer 2b; the top layer 2c is made of a P-type epitaxial conductive layer; and the base layer 2b is made of a P-type conductive layer whose carrier density is higher than that of the top layer 2c.

Accordingly, the power IC device 1 including a P-channel type transistor as the trench power MOS transistor 10 can be provided. Also, because the base layer 2b located on the drain electrode 12a is made of a P-type conductive layer whose carrier density is higher than that of the top layer 2c, the electrical conductivity with the drain electrode 12a is increased.

Also, the power IC device 1 of the present embodiment, the trench power MOS transistor 10 is an N-channel type transistor. Preferably, the chip 2a includes a top layer 2c, a base layer 2b located under the top layer 2c, a drain electrode 12a of the trench power MOS transistor 10 located under the base layer 2b; the top layer 2c is made of an N-type epitaxial conductive layer; and the base layer 2b is made of the N-type conductive layer whose carrier density is higher than that of the top layer 2c.

Accordingly, the power IC device 1 including an N-channel type transistor as the trench power MOS transistor 10 can be provided. Also, because the base layer 2b located on the drain electrode 12 is made of the N-type conductive layer whose carrier density is higher than that of the top layer 2c, the electrical conductivity with the drain electrode 12a is increased.

Also, in the power IC device 1 of the present embodiment, the surface layer channel CMOS transistor 20 for controlling the trench power MOS transistor 10, and the trench power MOS transistor 10 are formed on the same chip 2a. This allows secure the safety operation of the trench power MOS transistor 10 by a single chip.

Furthermore, in a method for manufacturing the power IC device 1 in accordance with the present embodiment, the surface of the surface layer channel CMOS transistor 20 is protected while the trench power MOS transistor 10 is formed. This can reduce the limitations of the manufacturing process and simplify the same. Moreover, this can reduce the possibilities that the surface layer channel CMOS transistor 20 is damaged while the trench power MOS transistor 10 is formed, thereby resulting in the improvement of the reliability of the power IC device. For example, in the surface layer channel CMOS transistor 20, the gate insulating film 27 and the inversion channel region 22 located below the gate insulating film 27 are protected from being contaminated by dry-etching under the harsh condition, which is carried out while the trench power MOS transistor 10 is formed.

Also, in a method for manufacturing the power IC device 1 of the present embodiment, it is preferable that the protection layer is made of a polysilicon layer 33. According to this, the protection layer has high stability to heat so as to surly protect the surface layer channel CMOS transistor 20 while the trench power MOS transistor 10 is formed.

Further, in a method for manufacturing the power IC device of the present embodiment, when the opening of the trench 3 is covered with the insulating layer, the SiN layer 35 self-aligned with the opening of the trench 3, or the SiN layer 35 having an identical opening with the opening of the trench 3 is used as a pattern mask. This allows forming the insulating layer selectively at the opening of the trench 3.

Since the insulating layer can be formed selectively, it is possible to downsize and densify the trench power MOS transistor 10, for example, in the case of forming a trench power MOS transistor 10 having a plurality of trenches 3. Namely, the insulating layer is surly formed at the opening of the trench 3 because of the self-alignment of the masking layer. Therefore, it is not necessary to widen the space between the trenches, taking into consideration a displacement of the pattern mask.

As a result, it is possible to narrow the space between the trenches. Moreover, it is not necessary to establish a connection to the source in each of the trenches 3 taking into consideration the insufficient insulation of the gate electrode 11. Therefore, after forming the source region over the entire surface of the silicon wafer 2, it is possible to shape the source region 14 to cover a plurality of adjacent trenches 3 by patterning as a sequential shape. This allows the downsizing and densification of the trench power MOS transistor.

Furthermore, in a method for manufacturing the power IC device 1 as an embodiment of the present invention, it is preferable that the masking layer is made from silicon nitride. This allows (i) the insulating layer effectively to be formed only at the openings of the trench 3 and (ii) a reduction in the detachment, when the openings of the trench 3 are covered with the insulating layer.

The present invention is not limited to the above embodiment. Wide variety of alteration is available within the range defined in claims. Namely, any embodiments that will be obtained by combining the technical means, which are altered within the range defined in claims as needed, should also be included in the technical scope of the present invention.

For example, the trench 3 in the power IC device in the present invention is not limited to the above embodiment. For example, the number of the trench 3 is not limited. The trench power MOS transistor 10 may include one or a plurality of trench 3. Preferably, the number of trench 3 is from 3 to 5 to satisfy the following two points, i.e., to secure the current flow in the drain region 14, and to increase the density of the power IC device 1.

Furthermore, the material of which the source region 14 of the trench power MOS transistor 10 and the gate electrode 21a of the surface layer channel CMOS transistor 20 are made is not particularly limited. For example, it is preferable to use amorphous silicon, polysilicon, or polycide as the material because a known IC manufacturing technique can be used.

Further, amorphous silicon can be used because it can grow and become epitaxial silicon by heating up at 600° C. or higher.

Alternatively, polysilicon can be used because polysilicon can be formed easily by CVD (Chemical Vapor Deposition) at about 550° C. under good control and can fulfill the characteristics which the source region 14 and the gate region 21a should have.

Alternatively, poly salicide can be used to fulfill the characteristic which the source region 14 and the gate electrode 21a should have. Note that poly salicide means a layered object including a silicon layer as a bottom layer and a tungsten salicide (W Six) as a top layer.

As explained above, in the power IC device in the present invention, it is preferable that the source region of the trench power MOS transistor and the gate electrode of the surface layer channel CMOS transistor are formed in the same layer, which is made of amorphous silicon, polysilicon, or polycide.

According to the invention, the layer, which is used for the source region of the trench power MOS transistor and the gate electrode of the surface layer channel CMOS transistor, is made of amorphous silicon, polysilicon, or polycide. Therefore, a conventional IC manufacturing technique can be used to form the layer. This makes it easy to form the layer, to dope with respect to the layer, and to form a pattern by etching. Moreover, the layer can reduce the limitations of manufacturing conditions because the layer is easily controlled during being formed because of the high stability to heat.

Further, in the power IC device of the present invention, the trench power MOS transistor is a P-channel type transistor. Preferably, the chip includes a top layer, a base layer located under the top layer, and a drain electrode of the trench power MOS transistor located under the base layer; the top layer is made of a P-type epitaxial conductive layer; and the base layer is made of a P-type conductive layer whose carrier density is higher than that of the top layer.

Thus, the power IC device including a P-channel type transistor as the trench power MOS transistor can be provided. Also, because the base layer located on the drain electrode is made of a P-type conductive layer whose carrier density is higher than that of the top layer, the electrical conductivity with the drain electrode is increased.

Also, in the power IC device in the present invention, the trench power MOS transistor is an N-channel type transistor. Preferably, the chip includes a top layer, a base layer located under the top layer, and a drain electrode of the trench power MOS transistor located under the base layer; the top layer is made of an N-type epitaxial conductive layer; and the base layer is made of an N-type conductive layer whose carrier density is higher than that of the top layer.

Thus, the power IC device including an N-channel type transistor as the trench power MOS transistor can be provided. Also, because the base layer located on the drain electrode is made of an N-type conductive layer whose carrier density is higher than that of the top layer, the electrical conductivity with the drain electrode is increased.

Also, in the power IC device in the present invention, it is preferable that the surface layer channel CMOS transistor is formed for controlling the trench power MOS transistor.

According to the present invention, the surface layer channel CMOS transistor for controlling the trench power MOS transistor and the trench power MOS transistor are formed on the same chip. This allows secure the safety operation of the trench power MOS transistor by a single chip.

Further, in a method for manufacturing the power IC device of the present invention, it is preferable to follow the following steps. The process of forming the surface layer channel CMOS transistor includes the process of forming the gate insulating film on the inversion channel region. After forming the gate insulating film of the surface layer channel CMOS transistor, the surface of the surface layer channel CMOS transistor should be protected by the protection layer while the trench power MOS transistor is formed.

According to the invention, the surface of the surface layer channel CMOS transistor is protected while the trench power MOS transistor is formed. This can reduce the limitations of the manufacturing process and simplify the same. Moreover, this can reduce the possibilities that the surface layer channel CMOS transistor is damaged while the trench power MOS transistor is formed, thereby resulting in the improvement of the reliability of the power IC device. For example, in the surface layer channel CMOS transistor, the gate oxidized film and the channel region located below the gate oxidized film are protected from being contaminated by dry-etching under the harsh condition, which is carried out while the trench power MOS transistor is formed.

Also, in a method for manufacturing the power IC device of the present invention, it is preferable that the protection layer is made of a polysilicon layer.

According to this, the protection layer has high stability to heat so as to surly protect the surface layer channel CMOS transistor while the trench power MOS transistor is formed.

Further, in a method for manufacturing the power IC device of the present invention, it is preferable to follow the following steps. The gate insulating film is formed in the surface layer channel CMOS transistor, and the surface of the surface layer channel CMOS transistor is protected by the protection layer. After that, in the process of forming a trench in a part of the surface layer of the wafer for forming the trench power MOS transistor, form a masking layer on the surface of the wafer first. Then form a trench on the surface of the wafer from above the masking layer. In the process of forming a gate region embedded in the trench, form a current-conducting region inside the trench first, and cover the opening of the trench which has the current-conducting region inside with the insulating layer by using the masking layer having the opening as a pattern mask.

According to the invention, when the opening of the trench is covered with the insulating layer, the masking layer self-aligned with the opening of the trench, or the masking layer having an identical opening with the opening of the trench is used as a pattern mask. This allows forming the insulating layer selectively at the opening of the trench.

Since the insulating layer can be formed selectively, for example, when the trench power MOS transistor including a plurality of trenches is formed, its downsizing and density growth are possible. Namely, according to a conventional trench power MOS transistor, it was difficult to achieve the high density because of the following fist and second reasons: the first reason is that a space between adjacent trenches should be widely formed; and the second reason is that the source regions should be formed individually for each trench. The first reason is based on the fact that the space between adjacent trenches should be wide, taking into consideration the displacement of the pattern mask in the process of covering the openings of the trenches by the insulating layer. The second reason is based on the fact that it was necessary to avoid the short circuit between the gate region and the source region due to the insufficient insulation caused by the displacement of the insulating layer. In other words, it was necessary to form the source region only in the area in which no trench is formed so that the short circuit between the gate region and the source region is avoided.

On the contrary, in the present invention, the insulating layer is surely formed at the openings of the trenches because of the self-alignment of the masking layer. Therefore, it is not necessary to widen the space between adjacent trenches in considering the displacement of the pattern mask. As a result, it is possible to narrower the space between adjacent trenches. Moreover, it is not necessary to form a connection with the source in every trench, taking into consideration the insufficient insulation at the gate region. Therefore, after forming the source region over the entire surface of the silicon wafer, it is possible to shape the source region 14 to cover a plurality of adjacent trenches 3 by patterning as a sequential shape. This allows the downsizing and densification of the trench power MOS transistor.

Also, in a method for manufacturing the power IC device in the present invention, it is preferable that the masking layer is a layer made from silicon nitride.

This allows (i) the insulating layer effectively to be formed only at the openings of the trenches, and (ii) a reduction in the detachment, when the openings of the trenches are covered by the insulating layer.

INDUSTRIAL APPLICABILITY

The present invention provides a power IC (Integrated Circuit) device including (i) a source region of a trench power MOS (Metal Oxide Semiconductor) transistor and (ii) a gate electrode of a surface layer channel CMOS (Complementary Metal Oxide Semiconductor) transistor, both of the (i) and (ii) being formed in the same layer which is formed during the same manufacturing process (step). As such, it is possible to manufacture a power IC device at a low cost. Thus, the present invention is applicable to a circuit which requires high current switching and/or high voltage switching.

The invention claimed is:

1. A power IC device comprising:
a surface layer channel CMOS transistor and a trench power MOS transistor which are formed on a same chip,
a drain electrode formed over an entire back surface layer of the chip,
the trench power MOS transistor including,
a gate region embedded in a trench,
an inversion channel region formed on a sidewall of the trench,
a single source region formed above the gate region and the inversion channel region, the source region having a thickness that is about uniform, with a continuous, flat, non-disjointed bottom surface,
wherein:
the source region of the trench power MOS transistor is provided at the same level and formed of a same layer as a gate electrode of the surface layer channel CMOS transistor.

2. The power IC device in claim 1, wherein:
the same layer by which the source region of the trench power MOS transistor and the gate electrode of the surface layer channel CMOS transistor are formed of a same material, the material being amorphous silicon, polysilicon, or polycide.

3. The power IC device in claim 1, wherein:
said trench power MOS transistor is a P-channel type transistor;
said chip includes a top layer, a base layer located under the top layer, wherein the drain electrode located on the trench power MOS transistor portion of the power IC device is located under the base layer;
said top layer spanning across the MOS and CMOS transistors, the top layer being made of a P-type epitaxial conductive layer; and
said base layer spanning across the MOS and CMOS transistors, the base layer being made of a P-type conductive layer whose carrier density is higher than that of the top layer.

4. The power IC device in claim 1, wherein:
said trench power MOS transistor is a N-channel type transistor;
said chip includes a top layer, a base layer located under the top layer, wherein the drain electrode located on the trench power MOS transistor portion of the power IC device is located under the base layer;
said top layer being a layer spanning across the MOS and CMOS transistors, the top layer being made of an N-type epitaxial conductive layer; and
said base layer being a layer spanning across the MOS and CMOS transistors, the base layer being made of an N-type conductive layer whose carrier density is higher than that of the top layer.

5. The power IC device in claim 1, wherein:
said surface layer channel CMOS transistor is formed for controlling the trench power MOS transistor.

6. A power IC device comprising:
a surface layer channel CMOS transistor and a trench power MOS transistor which are formed on a same chip,
the trench power MOS transistor including,
a gate region embedded in a trench,
an inversion channel region formed on a sidewall of the trench,
a single source region formed above the gate region and the inversion channel region, the source region having a thickness that is about uniform, with a continuous, flat, non-disjointed bottom surface,
a drain electrode formed over an entire back surface layer of the chip,
wherein:
the source region of the trench power MOS transistor and a gate electrode of the surface layer channel CMOS transistor are formed in a same layer.

7. The power IC device in claim 6, wherein:
the same layer by which the source region of the trench power MOS transistor and the gate electrode of the surface layer channel CMOS transistor are formed of a same material, the material being amorphous silicon, polysilicon, or polycide.

8. The power IC device in claim 6, wherein:
said trench power MOS transistor is a P-channel type transistor;
said chip includes a top layer, a base layer located under the top layer, wherein the drain electrode located on the trench power MOS transistor portion of the power IC device is located under the base layer;
said top layer spanning across the MOS and CMOS transistors, the top layer being made of a P-type epitaxial conductive layer; and
said base layer spanning across the MOS and CMOS transistors, the base layer being made of a P-type conductive layer whose carrier density is higher than that of the top layer.

9. The power IC device in claim 6, wherein:
said trench power MOS transistor is a N-channel type transistor;
said chip includes a top layer, a base layer located under the top layer, wherein the drain electrode located on the trench power MOS transistor portion of the power IC device is located under the base layer;
said top layer spanning across the MOS and CMOS transistors, the top layer being made of an N-type epitaxial conductive layer; and
said base layer spanning across the MOS and CMOS transistors, the base layer being made of an N-type conductive layer whose carrier density is higher than that of the top layer.

10. The power IC device in claim 6, wherein:
said surface layer channel CMOS transistor is formed for controlling the trench power MOS transistor.

11. A power IC device comprising:
a surface layer channel CMOS transistor and a trench power MOS transistor which are formed on a same chip,
said surface layer channel CMOS transistor including:
an inversion channel region formed in a part of a surface layer of the chip, in which part no trench is formed, so as to be in parallel with the surface layer; and
a gate electrode formed on the inversion channel region,
said trench power MOS transistor including:
a gate region embedded in the trench, which is formed in a part of the surface layer of the chip;
an inversion channel region formed on a sidewall of the trench;
a single source region formed above the gate region and the inversion channel region, the source region having a thickness that is about uniform, with a continuous, flat, non-disjointed bottom surface; and a drain electrode formed over an entire back surface layer of the chip, the source region of the trench power MOS transistor and the gate electrode of the surface layer channel CMOS transistor being formed in a same layer.

12. The power IC device in claim 11, wherein:

the same layer by which the source region of the trench power MOS transistor and the gate electrode of the surface layer channel CMOS transistor are formed of a same material, the material being amorphous silicon, polysilicon, or polycide.

13. The power IC device in claim 11, wherein:

said trench power MOS transistor is a P-channel type transistor;

said chip includes a top layer, a base layer located under the top layer, wherein the drain electrode located on the trench power MOS transistor portion of the power IC device is located under the base layer;

said top layer spanning across the MOS and CMOS transistors, the top layer being made of a P-type epitaxial conductive layer; and said base layer spanning across the MOS and CMOS transistors, the base layer being made of a P-type conductive layer whose carrier density is higher than that of the top layer.

14. The power IC device in claim 11, wherein:

said trench power MOS transistor is a N-channel type transistor;

said chip includes a top layer, a base layer located under the top layer, wherein the drain electrode located on the trench power MOS transistor portion of the power IC device is located under the base layer;

said top layer spanning across the MOS and CMOS transistors, the top layer being made of an N-type epitaxial conductive layer; and said base layer spanning across the MOS and CMOS transistors, the base layer being made of an N-type conductive layer whose carrier density is higher than that of the top layer.

15. The power IC device in claim 11, wherein:

said surface layer channel CMOS transistor is formed for controlling the trench power MOS transistor.

16. A method for manufacturing a power IC device, the method comprising:

forming a surface layer channel CMOS transistor and a trench power MOS transistor in a same wafer, the trench power MOS transistor including,
  a gate region embedded in a trench,
  an inversion channel region formed on a sidewall of the trench,
  a single source region formed above the gate region and the inversion channel region, the source region having a thickness that is about uniform, with a continuous, flat, non-disjointed bottom surface;

the forming of the transistors including forming a gate electrode of the surface layer channel CMOS transistor and forming a source region of the trench power MOS transistor in a same step; and forming a drain electrode over and an entire back surface of the wafer.

17. A method for manufacturing the power IC device in claim 16, further comprising the steps of:

forming a gate insulating film on the inversion channel region, in said surface layer channel CMOS transistor, and protecting the surface layer channel CMOS transistor by a protection layer, after the gate insulating film of the surface layer channel CMOS transistor is formed and while the trench power MOS transistor is formed.

18. A method for manufacturing the power IC device in claim 17, wherein:

said protection layer is made of a polysilicon layer.

19. A method for manufacturing the power IC device in claim 17, wherein:

in case of fabricating said trench power MOS transistor, after forming the gate insulating film of the surface layer channel CMOS transistor and protecting the surface layer channel CMOS transistor by the protection layer, in forming a trench in a part of the surface layer of the wafer, a masking layer is formed on the surface layer of the wafer, and then a trench is formed on the surface of the wafer from above the masking layer;

in forming a gate region embedded in the trench, a conductive region is formed in the trench and an opening of the trench having the conductive region is covered with the insulating layer by using the masking layer having the opening as a pattern mask.

20. A method for manufacturing the power IC device in claim 19, wherein:

the masking layer is made of silicon nitride.

21. A method for manufacturing a power IC device, the method comprising:

forming a surface layer channel CMOS transistor and a trench power MOS transistor in a same wafer, the forming of the surface layer channel CMOS transistor including forming an inversion channel region in a part of a surface layer of the wafer, in which part no trench is formed, so as to be in parallel with the surface layer, the forming of the trench power MOS transistor including forming a trench in a part of a surface layer of the wafer, embedding a gate region in the trench, and forming an inversion channel region on a sidewall of the trench, the forming of the surface layer channel CMOS transistor including forming gate electrode on the inversion channel region;

forming a single source region above the gate region and the inversion channel region of the trench power MOS transistor, and forming a gate electrode of the surface layer channel CMOS transistor, in a same step, the source region having a thickness that is about uniform, with a continuous, flat, non-disjointed bottom surface; and forming a drain electrode over an entire back surface of the wafer.

22. A method for manufacturing the power IC device in claim 21, further comprising the steps of:

forming a gate insulating film on the inversion channel region, in said surface layer channel CMOS transistor, and protecting a surface of the surface layer channel CMOS transistor by a protection layer, after the gate insulating film of the surface layer channel CMOS transistor is formed and while the trench power MOS transistor is formed.

* * * * *